United States Patent
Hackenberg et al.

(10) Patent No.: US 12,341,342 B2
(45) Date of Patent: Jun. 24, 2025

(54) METHOD FOR DETERMINING AN ELECTRICAL TRANSFER ENERGY FLOW INTO OR OUT OF A RESERVE UNIT, USE OF THE RESULT OF THIS METHOD, AND CONTROL SYSTEM FOR CARRYING OUT THE METHOD

(71) Applicant: sonnen, GmbH, Wildpoldsried (DE)

(72) Inventors: Bastian Hackenberg, Stottwang (DE); Jakob Giza, Sulzberg (DE)

(73) Assignee: sonnen, GmbH, Wildpoldsried (DE)

( * ) Notice: Subject to any disclaimer, the term of this patent is extended or adjusted under 35 U.S.C. 154(b) by 189 days.

(21) Appl. No.: 18/280,260

(22) PCT Filed: Mar. 7, 2022

(86) PCT No.: PCT/DE2022/100177
§ 371 (c)(1),
(2) Date: Sep. 4, 2023

(87) PCT Pub. No.: WO2022/184212
PCT Pub. Date: Sep. 9, 2022

(65) Prior Publication Data
US 2024/0063639 A1    Feb. 22, 2024

(30) Foreign Application Priority Data
Mar. 5, 2021  (DE) .................. 102021105425.7

(51) Int. Cl.
*H02J 3/32* (2006.01)
*G01R 22/06* (2006.01)
*H02J 3/38* (2006.01)

(52) U.S. Cl.
CPC ............. *H02J 3/32* (2013.01); *G01R 22/06* (2013.01); *H02J 3/381* (2013.01); *H02J 2300/24* (2020.01)

(58) Field of Classification Search
CPC .......... H02J 3/32; H02J 3/381; H02J 2300/24; H02J 2310/12; H02J 7/35; G01R 22/06; G01R 22/10; Y02E 10/56; Y02P 80/20
See application file for complete search history.

(56) References Cited

U.S. PATENT DOCUMENTS

| | | | |
|---|---|---|---|
| 2009/0177595 A1* | 7/2009 | Dunlap ................ | B60L 53/31 320/109 |
| 2011/0159389 A1* | 6/2011 | Ohara .................. | G05B 13/02 429/429 |

(Continued)

FOREIGN PATENT DOCUMENTS

DE   102017121457 A1   3/2019

*Primary Examiner* — Lee E Rodak
*Assistant Examiner* — Zannatul Ferdous
(74) *Attorney, Agent, or Firm* — Clive McClintock (57) ABSTRACT

The invention relates to a method for determining an electrical transfer energy flow (E) into or out of a reserve unit (RE) comprising: • an electrical consumer group (D), • an electrical energy storage system (ESS) comprising an electrical energy store (B) and • an electrical energy generation apparatus (PV), wherein the reserve unit (RE) is connected to an electrical transmission network (G) via a first electrical counter device (Z1) for ascertaining the network energy flows between the transmission network (G) and the reserve unit (RE). According to the invention, the method comprises the steps of: • ascertaining an energy consumption flow (Ed) of the electrical consumer group (D) per unit of time; • ascertaining a network energy flow (Eg2re) from the electrical transmission network (G) into the reserve unit (RE) per unit of time; • ascertaining a generator energy flow of the electrical energy generator apparatus (PV) per unit of time; • ascertaining a store energy flow (Ebe) between the electrical energy store (B) and the electrical consumer group (D) and/or the electrical transmission network (G) per unit of time; and • determining the transfer energy flow (E) in the (Continued)

unit of time using the energy conversion law, wherein additional electrical energy flows are ascertained within the reserve unit (RE) by additional counter devices (Z2, Z3) such that, for different scenarios and boundary conditions, the transfer energy flow (E) is present as a measured value of a single of the first or one of the additional electrical counter devices (Z1, Z2, Z3). The invention also relates to the use of the result of this method and to a control device (SE) configured and designed to carry out this method or to the use of the method results.

11 Claims, 5 Drawing Sheets

(56) References Cited

U.S. PATENT DOCUMENTS

| | | | |
|---|---|---|---|
| 2012/0150361 A1* | 6/2012 | Lazaris | H02J 3/466 700/297 |
| 2015/0276829 A1* | 10/2015 | Shamir | G01R 21/133 702/62 |
| 2020/0303944 A1* | 9/2020 | Jonsson | G01R 19/10 |
| 2021/0135489 A1* | 5/2021 | Stites-Clayton | H02J 13/00004 |

* cited by examiner

METHOD FOR DETERMINING AN ELECTRICAL TRANSFER ENERGY FLOW INTO OR OUT OF A RESERVE UNIT, USE OF THE RESULT OF THIS METHOD, AND CONTROL SYSTEM FOR CARRYING OUT THE METHOD

TECHNICAL FIELD

The present disclosure relates to the field of energy management generally, and more specifically to methods and systems of determining the flow of energy into and out of a reserve unit.

BACKGROUND OF THE INVENTION

Private and commercial operators of devices for the generation of electrical energy, which devices may comprise for example photovoltaic systems, wind turbines, electrical generators converting biomass and cogeneration plants, are currently feeding portions of the power they generated themselves in the form of current into electrical transmission networks. In many countries, there are systems in effect which are paying feed-in compensation to the operator for the contribution of electrical energy which was generated in a renewable way. The amount of the feed-in compensation has fallen considerably over the last years, especially in Germany. Therefore, from a business point of view, the interest of the operators of the devices for the generation of electrical energy has continued to grow when it comes to privately consuming the electrical energy which they generated themselves by using groups of electrical consumers which are connected to the transmission network and which are owned by the operators. The set of the electrical consumers of the operator, which is forming an groups of electrical consumers is defined by a common point of connection to the transmission network.

Within the framework of this patent application the electrical energy which was self-generated by the private or commercial operator of the devices for the generation of electrical energy in the form of electrical so-called green current is termed as "green energy". In contrast to that, the electrical current which is drawn from the transmission network is termed as grey current, which is termed in the following as "grey energy". The term grey energy is being used independently of the way in which this grey energy was generated. Thus, the term grey energy is also applied in the framework of the present invention for energy which was generated in a climate neutral way and which is supplied from the transmission network to the groups of electrical consumers of the operators.

In order to raise the percentage of the energy which is used on the side of the operator himself, it is helpful to couple a storage system for electrical energy to the group of consumers connected to the transmission network. Such a system for electrical energy storage comprises a storage for electrical energy, preferably in the form of a chargeable and dischargeable battery device. At times at which the demand of the group of electrical consumers for electrical power is greater than the electrical power provided by the operator's own device for the generation of electrical energy, the amount of electrical power which is missing can be provided by the battery device. However, on a regulatory basis it is not permissible that grey energy from the transmission network is being stored in the battery device and is fed as energy, which is supposedly green energy, into the transmission network at a later time. As the metrological infrastructure does currently not enable an unambiguous determination whether green energy or grey energy is being fed from the battery device into the transmission network or is being used by the group of electrical consumers, it is not possible to store green energy and grey energy in combination in one and the same battery device. It is uneconomic and not resource-efficient to install two separate battery devices which are charged only with green energy or only with grey energy, respectively.

The operators of the transmission networks and traders of electricity have a great interest in being able to use systems for energy storage, which have been installed privately or commercially, in the service of the transmission network or in the service of electricity trading. The operator of the systems for energy storage is receiving payment for these uses. Therefore, it is necessary to determine the energy flows, which are termed in this patent application as transfer energy flows, in such a way that these energy flows can be used in a way usable in an accounting balance sheet for a calculation of a payment towards the operator of the energy storage devices.

From the point of view of the operators of the transmission networks so called reserve units, which were formerly termed as technical units and which provide electrical operating reserve, have typically such a potential in terms of power that these reserve units can provide or receive negative and/or positive operating reserve in the form of primary operating reserve, which is now termed as FCR (Frequency Containment Reserve) or in the form of secondary operating reserve, which is now termed as aFRR (automated Frequency Restoration Reserve), in the range of many Megawatts. Typically, these reserve units are separate hydroelectric or gas power plants which generate electrical energy in a power range of many Megawatts each, where these power plants can be powered up or curtailed to provide the desired positive or negative electrical operating reserve accordingly.

BRIEF SUMMARY OF THE INVENTION

Within the framework of the present invention the technical term of reserve unit is defined very much smaller than customary in the field. This means that a reserve unit in the sense of the invention exists for example already in the form of a system, which has a single electrical energy storage coupled to a single defined group of electrical consumers. The reserve unit is defined specifically as the sum of all the electrical power units where the flows of electrical power between this sum of electrical power units and an external transmission network can be recorded with an electrical meter, which is typically calibrated, at a common point of connection to the transmission network. The electrical power units are herein formed:

purely for the intake of electrical energy, for example all common consumers in a building network,
  as a combination unit for both the intake and the discharge of electrical energy, for example an energy storage device in a building which is formed as a battery, or
  purely for the discharge of electrical energy, for example a photovoltaic installation on or at the building.

The term "purely for the intake" means in the framework of the present invention that a discharge of electrical energy from the electrical power unit is technically not possible or only in an amount which is less than 10% as compared to the intake of electrical energy. The correspondingly reciprocal definition applies for the term "purely for the discharge".

According to this far-ranging definition a reserve unit, as it is preferably considered within the framework of this invention, may comprise:
- a group of electrical consumers which group is defined by a point of connection to the transmission network and comprises electrical power units purely for the intake of electrical energy;
- a device for the generation of electrical energy as an electrical power unit purely for the discharge of electrical energy; and
- a storage system for electrical energy as an electrical power unit both for the intake and for the discharge of electrical energy.

This combination of electrical power units can be found frequently in buildings which are being used privately and/or commercially and which are connected by a point of connection to a transmission network. This point of connection to the transmission network comprises a first electrical meter device, which is preferably calibrated and which is recording the flow of electrical energy between the transmission network to which it is connected and the reserve unit. This first electrical meter device is determining a meter reading $Z1d$ as a network energy flow from the transmission network into the reserve unit. Further, the first electrical meter device is determining a meter reading $Z1u$ as network energy flow out of the reserve unit into the electrical transmission network. Therefore, the first electrical meter device is preferably made as a bidirectional meter.

Within the framework of this invention electrical energy flows are to be understood as amounts of electrical energy which are flowing between defined points of connection. By considering defined electrical energy flows in defined time intervals the electrical energy flow becomes an electrical power flow. However, the following discussion is primarily about electrical energy flows because the corresponding time intervals do not matter.

From DE 10 2017 121 457 A1 a system and a method for the metering of electrical power is known which counters the problem of metering green current and grey current separately and accurately for accounting in a balance sheet, and thereby the desired registering of the transfer energy flows by the application of additional hardware for metering in the area of the groups of consumers in the form of building networks. However, this system and method has the drawback that a multitude of further metering devices have to be installed in combination with a sensor for the direction of the energy flow in order to achieve this goal.

Therefore, the problem of the present invention is to provide a method which enables the determination of transfer energy flows in and out of a reserve unit accurately for accounting in a balance sheet with less effort. Further, it is a problem of the invention to provide a use of the results of the method and a control system which implements this use of the results of the method.

According to one embodiment of the present invention the method may comprise the following method tasks: determining an intake energy flow comprising the group of electrical consumers in a defined time interval, determining a network energy flow between the electrical transmission network and the reserve unit in the defined time interval, determining a generator energy flow of the device for the generation of electrical energy in the defined time interval, determining storage energy flow between the storage of electrical energy of the storage system for electrical energy and the group of electrical consumers and/or the electrical transmission network in the defined time interval and determining transfer energy flow in the defined time interval according to the law of energy conservation, wherein further electrical energy flows within the reserve unit between at least two components selected from: the energy storage system, the device for the generation of energy and the group of electrical consumers are determined by further electrical meter devices in such a way that, in a case differentiation selected from the two case groups: the energy generating device generates more electrical power than required by the group of electrical consumers and the energy generating device generates no of the same amount on less electrical power than demand from the group of electrical consumers combined with a boundary condition selected from: the storage for electrical energy is charging and the storage for electrical energy is discharging, the transfer energy flow occurs as a measured value of a single one of the first or one of the further electrical meter devices for the selected case group with the combined boundary condition. The method tasks of determining different energy flows in the defined time interval can be performed directly or indirectly.

Directly determining an energy flow to be determined is performed by arranging and reading one of the electrical meter devices selected from the group of the first electrical meter device and the further electrical meter devices in a way that the measured value which has been determined by the electrical meter device corresponds directly to the energy flow to be determined. This applies for example for the network energy flow between the electrical transmission network and the reserve unit through the first electrical meter device in the area of the point of connection to the transmission network. As already mentioned, the first electrical meter device determines the electrical energy flow out of the transmission network into the reserve unit as a measurement value $Z1d$ and the electrical energy flow out of the reserve unit into the transmission network as a measurement value $Z1u$.

Indirectly determining an energy flow to be determined is performed by accounting of measurement values of several electrical meter devices selected from the group of the first electrical meter device and the further electrical meter devices in a way that the energy flow to be determined is obtained by a calculation and thus in an indirect way. This applies for example for the amount of electrical energy which is generated by the reserve unit itself by use of the device for the generation of electrical energy and which is consumed by the group of electrical consumers. Especially when the device for the generation of electrical energy generates in total more electrical power than is being required in the group of electrical consumers, a part of the total generated power flows into the transmission network as feed-in power and/or a part of the total generated power flows into the storage system for electrical energy. In this case the amount of the consumer energy flow from the device for the generation of electrical energy can only be determined indirectly by calculating the measurement values of several electrical meter devices.

Even when by the calculating of measurement values of different electrical meter devices an energy flow which is to be determined according to the invention occurs only as a byproduct, this realizes the claimed feature of determining an energy flow.

According to the invention, the goal of the selection and arrangement of further electrical meter devices in the reserve unit in a way that the transfer energy flow is finally available as the measurement value of one single electrical meter device arises from the following background. For the determined transfer energy flow to be usable for accounting in a balance sheet, this must be available as a measurement value of an electrical meter device which is calibrated. Even when two measurement values from two calibrated measurement devices are being used in order to calculate the transfer energy flow from two measurement values, the calculation of two measurement values does only constitute a measurement parameter and no longer a measurement value according to the regulatory provisions which are in force in Germany for the energy sector. A measurement parameter is not usable for accounting in a balance sheet. Measurement values can be generated exclusively by calibrated meter devices according to the regulations mentioned above. The application of a plurality of calibrated electrical meter devices involves significantly higher costs and an increased effort in administration. Therefore it is in the interest of the operators of the reserve units described above to keep the number of calibrated electrical meter devices as low as possible while having at the same time a determination of the transfer energy flow which is usable for accounting in a balance sheet.

However, in the framework of the present invention the terminological distinction between measurement values and measurement parameters is not applied in the way described above. Each of the electrical meter devices provides measurement values, independent of the question if they are calibrated are not. At least according to the regulations which are in force in Germany those electrical meter devices, whose measurement values are representing the transfer energy flows for the respective case group with the combined boundary condition, must be calibrated to be usable for business accounting.

In the scenario of the specific case group including the combined boundary condition, the determination of the transfer energy flow is performed by applying the law of energy conservation. For a closed system, which is in this case the reserve unit with its own defined production of energy together with the transmission network to which it is connected, the amount of the total energy must be constant. Energy is a conserved quantity. In consequence, the energy flows within the reserve unit and the energy flows flowing into the reserve unit and out of the reserve unit can be selected and correlated to each other so that the transfer energy flows, which are serving for the transmission network or for energy trading, between the reserve unit and the transmission network can be calculated.

Preferably the determining of the generator energy flow is performed as a determining of the generator-to-consumer energy flow from the device for the generation of electrical energy into the group of electrical consumers within the defined time interval. This means that the amounts of the energy flows going out from the device for the generation of electrical energy, which are being fed into of the transmission network and/or serve to charge the device for electrical storage, have to be deducted from total of the energy flow generated by the device for the generation of electrical energy. In alternative variants of the method the total of the energy flow generated by the device for the generation of electrical energy is being determined which total is then correlated to the remaining energy flows which have been determined in such a way that the transfer energy is calculated while observing the law of energy conservation.

The determining of an intake energy flow can be preferably performed cumulatively or alternatively as a determining of the intake energy flow of the group of electrical consumers within the defined time interval. This deals exclusively with the intake power required by the group of electrical consumers.

If the determining of the generator energy flow is performed as a determining of a generator-to-consumer energy flow from the device for the generation of electrical energy into the group of electrical consumers and the determining of the intake energy flow is performed as a determining of the intake energy flow of the group of electrical consumers within the defined time interval, the determination of the transfer energy flow is performed according to the law of energy conservation by the formula:

$$E=(Ed-Epv2d-Ebe-Eg2re)$$

using: E transfer energy flow,
Ed intake energy flow of the group of electrical consumers,
$Epv2d$ generator-to-consumer energy flow,
Ebe storage energy flow between the storage of electrical energy and the group of electrical consumers and/or the electrical transmission network and
$Eg2re$ network energy flow from the transmission network into the reserve unit Further preferred, the method task of the determining of the generator energy flow from the device for the generation of electrical energy to the group of electrical consumers is performed within the defined time interval by the first further electrical meter device with a measurement value $Z2d$ for an energy flow in the direction towards the group of electrical consumers and/or in the direction towards the storage system for electrical energy and with a measurement value $Z2u$ for an energy flow with the opposite orientation wherein the device for the generation of electrical energy is connected between the first electrical meter device and the first further electrical meter device in such a way that electrical current which is generated by the device for the generation of electrical energy can be fed into the electrical transmission network through the first electrical meter device as well as it can be directed through the first further meter device to the group of electrical consumers and/or to the storage system for electrical energy, wherein the generator-to-consumer energy flow is always determined as the smaller energy flow of the following two energy flows:
intake energy flow and
total generator energy flow.

Here, the first further meter device serves for determining further energy flows within the reserve unit. These are represented by the measurement values $Z2d$ and $Z2u$. When determining the transfer energy flows for the two case groups (ratio of the generated electrical power over power intake of the group of electrical consumers) combined with the two boundary conditions which are respectively possible (battery is charging or battery is discharging), it can be found that the first further meter device is not needed for determining the transfer energy flow.

Additionally the method is preferably performed so that a total generator energy flow is determined by computing the difference between the measurement value $Z2d$ of the energy flow of the first further meter device in the measurement value $Z1d$ of the network energy flow and the following difference is added to that: the measurement value $Z2u$ is subtracted from the measurement value $Z1u$ as network energy flow out of the reserve unit into the electrical transmission network. The total generator energy flow comprises a total of the electrical energy generated by the device for the generation of electrical energy, especially a photovoltaic device, which can flow in at least one direction, selected from a group comprising the group of electrical consumers, the transmission network and the storage for electrical energy of the storage system for electrical energy.

A different arrangement of the first further meter device results correspondingly in a different calculation of the total generator energy flow.

In a further preferred embodiment the method is formed in such a way that a storage-to-consumer energy flow from the storage for electrical energy of the storage system for electrical energy to the group of electrical consumers is performed within the defined time interval by calculating a difference as follows: from the intake energy flow as it has been determined the energy flow $Z2d$ which has been measured with the first further electrical meter device is subtracted if the difference so formed is greater than zero, and if the difference so formed is smaller than zero the storage energy flow is set to zero. A different arrangement of the first further meter device results correspondingly in a different calculation of the total storage-to-consumer energy flow.

An especially preferred embodiment of the method is characterized in that an energy flow into the storage for electrical energy is determined by a measurement value $Z3d$ and that the storage energy flow out of the storage for electrical energy is determined by a measurement value $Z3u$ by means of the second further meter device arranged upstream of the storage of electrical energy. It is preferred that the second further meter device is formed as a two directional meter. It is further preferred that the second further meter device is being used in the form of a calibrated meter device. In this way energy flows flowing in and out of the storage for electrical energy can be determined in a way suitable for accounting in a balance sheet.

In an embodiment of the variant of the method comprising the first and second further meter devices as described above it is provided that the two case groups concerning the comparison of the size of the intake energy flow to the total generator energy flow are being determined by means of the measurement values of the first meter device and by means of the measurement values of the second further meter device as follows: for the size comparison the total generator energy flow corresponds to $Z1u-Z1d$ and the intake energy flow $Z3u-Z3d$. This follows from the fact that the following equations hold:

the total generator energy flow equals $Z2d-Z1d+Z1u-Z2u$ and the intake energy flow equals $Z2d-Z3d+Z3u-Z2u$, wherein both equations have the term $Z2d-Z2u$.
In consequence this term can be omitted for the size comparison of the two energy flows.

Further preferred for the case group that the total generator energy flow is larger than the intake energy flow:
  the transfer energy flow is determined as the measurement value $Z1d$ for the boundary condition that the storage for electrical energy is charging, meaning $Z3d>0$,
  the transfer energy flow is determined as the measurement value $Z3u$ for the boundary condition that the storage for electrical energy is discharging, meaning $Z3u>0$, and
for the case group that the total generator energy flow is smaller than or equal to the intake energy flow, including the case that the total generator energy flow equals zero.
  the transfer energy flow is determined as the measurement value $Z3d$ for the boundary condition that the storage for electrical energy is charging, meaning $Z3d>0$,
  the transfer energy flow is determined as the measurement value $Z1u$ for the boundary condition that the storage for electrical energy is discharging, meaning $Z3u>0$.

This follows from the fact that the amount of the transfer energy flow for the first case group (the total generator energy flow is greater than the intake energy flow) calculated as $Z3u+Z1d$, where further boundary condition of charging storage for electrical energy the measurement value $Z3u$, which corresponds to the discharge current of the storage for electrical energy, has to be equal to zero, and for the boundary condition of discharging storage for electrical energy $Z1d$ has to be zero, because the device for the generation of electrical energy is providing enough electrical power for the group of electrical consumers, so that there is no demand for an energy flow out of the electrical transmission network. For the same reason the energy flow in the form of the discharge current of the storage for electrical energy may further be not designated for the group of electrical consumers. The only possibility remaining is that the energy flow in the form of the discharge current of storage for electrical energy flows into the transmission network as a transfer energy flow. As the storage for electrical energy cannot be discharging and charging at the same time, the measurement value $Z1d$ of the meter has to be equal to zero in this scenario.

For the second case group: the total generator energy flow is smaller than or equal to the intake energy flow, the amount of the transfer energy flow is determined as $Z3d+Z1u$, wherein for the boundary condition of a charging storage for electrical energy the measurement value $Z1u$ of the meter has to be zero, because the total generator energy flow flows into the group of electrical consumers, so that nothing can be fed into the electrical transmission network. Furthermore, the storage for electrical energy is charging and cannot deliver a flow of electrical energy at the same time which energy flow flows into the electrical transmission network. Under the boundary condition of a discharging storage for electrical energy the measurement value $Z3d$ of the meter has inevitably to be zero and the measurement value $Z1u$ of the meter corresponds to the transfer energy flow, which is flowing coming out of the storage for electrical energy into the electrical transmission network, because the total generator energy flow is flowing into the direction of the group of electrical consumers. The same holds for the formula of the amount of transfer energy flow $Z3d+Z1u$ for the extreme case that the generator energy flow is equal to zero, because the device for the generation of electrical energy does not generate any electrical power.

The problem of the invention is further solved by the use of the results of one of the methods described above, wherein the measurement values of at least one electrical meter device are being determined for the determination of transfer energy flows between an electrical transmission network and the reserve unit according to the method, which measurement values have the transfer energy flow to be determined for the case groups and boundary conditions as defined according to the method.

The term of the reserve unit according to the method and the case groups and boundary conditions as defined according to the method includes the explanations above in the context of the method according to the invention in their full extent. This term was chosen in order to avoid repetitions by this reference instead.

The method according to the invention has to be performed at least once through the method tasks of determining further electrical energy flows in such a way that by applying the case distinction with the case groups together with the boundary conditions the transfer energy flow to be determined occurs as a measurement value of a single one of the first or one of the further electrical meter devices. Once this goal has been reached for one reserve unit together with its electrical meter devices, the next task is the repeat use of the result of the method, which has been obtained in this way in order to perform the desired determination of the transfer energy flow as often as desired.

As long as there is no change in the arrangement of the components of the reserve unit, the group of measurement values of the electrical meter devices remains the same according to the constellations of the case groups and boundary conditions, so that this group of measurement values can be used to determine the transfer energy flow as a simple measurement value. The determination of the transfer energy flow is performed by defined method tasks, which can be only defined, when the results of the method as described above are available. Therefore, the use of these results of the method exists in the form of a method of its own.

The use described above is preferably modified in such a way that intake energy flows, which are necessary for maintaining the system and which are directed into the storage system for electrical energy, and which are not comprised by intake energy flow of the group of electrical consumers, are being determined and accounted for with respect to the determined transfer energy flow.

Energy flows which are necessary for maintaining the system comprise especially the following energy flows:
an energy flow caused by the power intake of an inverter during standby which inverter is part of the energy storage system, when the storage of electrical energy is depleted and cannot supply the power intake during standby,
an energy flow caused by trickle charging the storage for electrical energy being part of the storage system for electrical energy and
an energy flow caused by periodically fully charging the storage for electrical energy being part of the storage system for electrical energy.

All these energy flows, which are necessary for maintaining the system, have in common that they cause an exchange of energy between the electrical transmission network and the storage for electrical energy being part of the storage system for electrical energy. These energy flows will also be registered during the determination of the transfer energy flow. This causes a distortion of the result of the transfer energy flow, because it is an energy consumption within the reserve unit and it is not the storage of gray current in the storage device for electrical energy.

The power intake of the inverter during standby has usually a typical value of a few watts, which is drawn from the electrical transmission network continuously during emergency operation, when the storage for electrical energy is so depleted that the energy supply for the inverter cannot be supplied from the storage for electrical energy. In this scenario, the result is an intake transfer energy flow of the reserve unit of a few watts. However, this is not an energy flow in the service of the transmission network or in the service of electricity trading, but an energy flow which is necessary for maintaining the system and which has to be considered when accounting for the transfer energy flow in a balance sheet.

This is similar in the case of an energy flow caused by trickle charging the storage for electrical energy from the electrical transmission network into the storage for electrical energy. For sustainable use of the storage for electrical energy it is necessary that this storage is protected against the so-called deep discharge. This is especially true when the storage for electrical energy is a rechargeable battery. For this, the storage for electrical energy is controlled when necessary in such a way that the storage is being charged up to a defined state of charge by means of a flow of electrical energy from the electrical transmission network. This is also a temporary solution for the case that the device for the generation of electrical energy can supply no or not enough energy. This energy flow which is necessary for maintaining the system will also show up as a part of the transfer energy flow which is being determined, however, it is neither in the service of the transmission network nor in the service of electricity trading. In consequence, this energy flow must also be considered when balancing the transfer energy flow for accounting.

In the same way it is necessary for sustainable use of storage for electrical energy, that the storage is completely charged with in defined time windows at least once. If this cannot be guaranteed by the device for the generation of electrical energy within the required time window, the required energy flow is drawn from the electrical transmission network as a temporary solution. The electrical power required for this is typically the maximum possible electrical power intake of the inverter which performs the conversion of AC from the electrical transmission network into DC which is required for charging the storage for electrical energy.

All the energy flows mentioned above which are necessary for maintaining the system can be recognized from typical values in the transfer energy flow. The recognition is simplified by the fact that the boundary conditions mentioned above:
device for the generation of electrical energy can supply no or not enough energy
state of charge of the storage for electrical energy is correspondingly low and
cycle time for a complete charge is reached without the storage of electrical energy being charged within the current cycle time for complete charge
are being registered by the control system. This information simplifies the calculation of the energy flows which are necessary for maintaining the system from the transfer energy flows which have been determined.

It is further preferred that all the above-mentioned uses of the results according to the method are modified in such a way that the use is performed in real time within defined time intervals in the range of 10 seconds to 15 minutes, preferably in the range from 30 seconds to 10 minutes and especially preferred in the range of one minute to five minutes. The defined time windows may vary. A significant change of the state of the system may for example cause an early termination of a time window and the start of a new one. This may apply for example when the power of the generation of electrical energy exceeds or falls below the demand of the group of electrical consumers. The occurrence of the case groups with the boundary conditions mentioned above constitutes such a significant change of the state of the system, for example. Accounting time periods can be selected and defined independently with respect to the defined time interval. Within these time periods the transfer energy flows which have been determined can be accounted for and become relevant in terms of accounting and balancing for the operator of the reserve unit.

As an alternative to a real-time evaluation the determination of the transfer energy flows can also be performed in retrospect by means of data sets of energy flows which have been saved. The same remarks apply as they have been mentioned above about the length of the time intervals and the time intervals for accounting which can be defined additionally.

It is preferred that one of the methods mentioned above or one of the uses of the results of the method described above is being performed in a control unit of the system for the storage of electrical energy. That is to say that the complete logic of the necessary algorithm is located in a decentralized way within the reserve unit. Alternatively it is also possible that the method of the use of the results of the method is performed in an evaluation unit outside of the reserve unit. Therefore, for this variant it is required that the data which have to be measured within the reserve unit, especially with respect to the energy flows there, are being transferred to the evaluation unit.

Finally the present invention relates to a control system which is formed and arranged to perform one of the methods described above or formed and arranged for the use of results obtained by one of the methods as described above. Additionally the control system can be embodied in a completely decentralized way for example within the reserve unit. Tentatively the components of systems can be positioned as a whole or in parts in other locations in the reserve unit which is localized in a decentralized way.

Purely as an example in the following an example for the application of the invention is explained with reference to the figures.

DETAILED DESCRIPTION OF THE INVENTION

Figure 1:
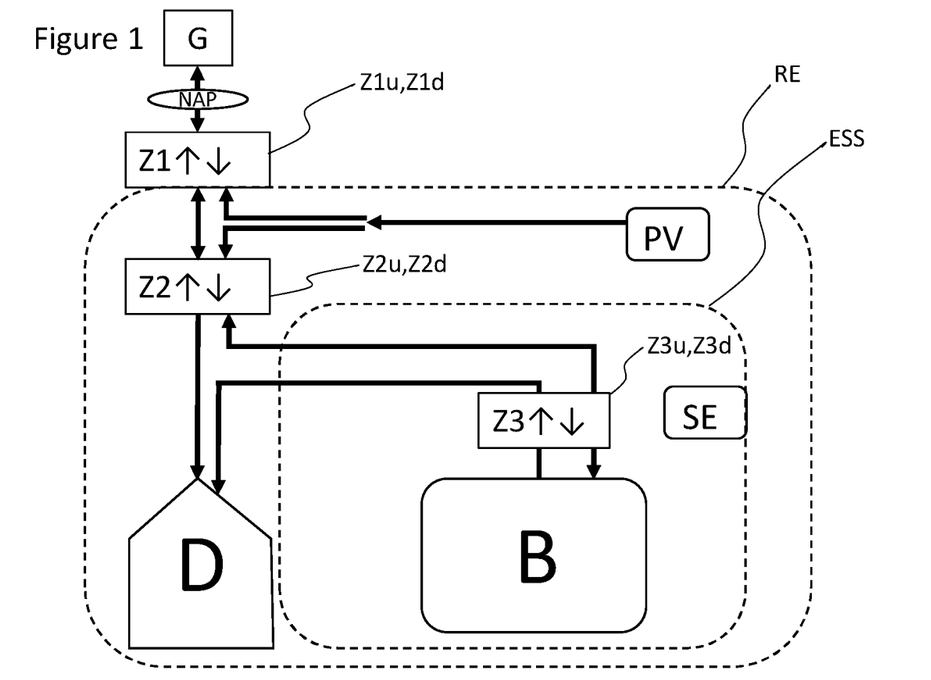
FIG. 1 is a schematic depiction of a reserve unit RE, which is connected to a transmission network for electrical energy, with a device PV for the generation of electrical energy with a storage system ESS for electrical energy comprising a storage B for electrical energy.

FIG. 1 is a schematic depiction of a reserve unit RE connected to an electrical transmission network G with a device PV for the generation of electrical energy and a system ESS for the storage of electrical energy comprising a storage B for electrical energy. Reserve units RE like these are often electrical networks of buildings into which the device PV for the generation of electrical energy and the storage system ESS for electrical energy are integrated. These electrical networks of buildings are connected to the electrical transmission network G by a so-called point NAP of connection to the network. In order to account for the energy flows from the electrical transmission network G into the reserve unit RE and out of the reserve unit RE into the electrical transmission network G in a way suitable for a balance sheet a first electrical meter device Z1, preferably in the form of a bidirectional meter, especially preferred the so-called smart meter, is deployed. The two directions for the determination of the energy flow Z1$u$ out of the reserve unit RE into the electrical transmission network G and of the energy flow Z1$d$ out of the electrical transmission network G into the reserve unit RE have been marked by the pair of arrows pointing upward and downward.

A first further electrical meter device Z2 is just as preferred formed as a two directional meter. Between the first electrical meter device Z1 and the first further electrical meter device Z2 the device PV for the generation of electrical energy is integrated into the reserve unit RE as a bifurcation. Thus the first further electrical meter device Z2 is determining an electrical meter value Z2$d$ for the energy flows directed downward to the group D of electrical consumers of the reserve unit RE and an electrical meter value Z2$u$ for the energy flows directed upward in the direction of the electrical transmission network G. A detailed explanation is applied in the following in the context of FIG. 2.

Below the first further electrical meter device Z2 is on one hand the group D of electrical consumers and on the other hand in a separate electrical branch the system ESS for the storage of electrical energy with the storage B for electrical energy. The energy flows in and out of the system ESS for the storage of electrical energy can be determined by means of the second electrical meter device Z3. The energy flows flowing in the direction of the storage B for electrical energy are registered as measurement values Z3$d$ and the energy flows flowing out of storage B for electrical energy in the direction of the electrical transmission network G are registered as measurement value Z3$u$. Further the system ESS for the storage of electrical energy has a control unit SE. This control unit SE serves for the control of all energy flows between the components of the system as a whole as shown in a way which is as optimal as possible as explained below.

Figure 2:
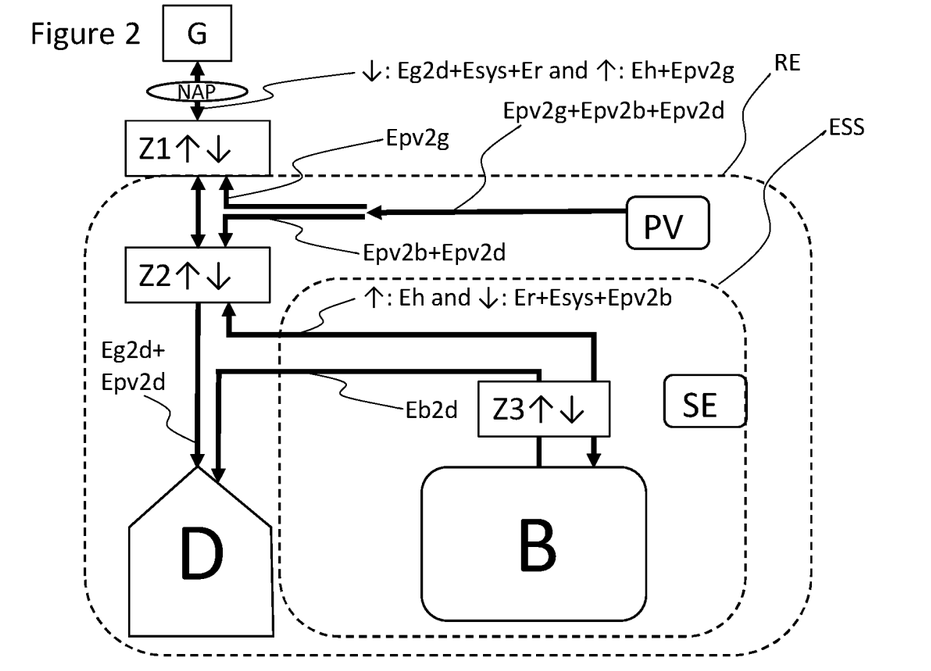
FIG. 2 is a schematic depiction of the energy flows as they can occur between the components of the system shown in FIG. 1 which components are interacting with each other.

FIG. 2 shows the energy flows which can occur between the interacting system components as shown in FIG. 1 with respect to the depiction of the system components which is identical to FIG. 1.

The sum of the energy flows which flow from the electrical transmission network G into the reserve unit is registered as measurement value Z1$d$. In detail, these are the following energy flows:

Eg2$d$, an energy flow reaching the group D of electrical consumers,

Esys, an energy flow serving the maintenance of the system in special states of the system, Er, a transfer energy flow from the electrical transmission network G into the storage B for electrical energy.

In the opposite direction the measurement value $Z1u$ represents the sum of the energy flows which are flowing out of the reserve unit RE into the electrical transmission network G. In detail, these are the following energy flows:

Epv2g, a feed-in energy flow of the device PV for the generation of electrical energy into the electrical transmission network G and Eh, a transfer energy flow from the storage B for electrical energy into the electrical transmission network G.

If the storage B for electrical energy is formed in such a way that this can only be charged or discharged at any time, then it follows that there can only be one transfer energy flow Er into the reserve unit RE or a transfer energy flow Eh out of the reserve unit RE at all times.

The energy flows flowing out of the device PV for the generation of electrical energy can be composed from the following amounts:

Epv2g, the energy flow which was mentioned already above from the device PV for the generation of electrical energy into the electrical transmission network G, Epv2b, an energy flow which is stored in the storage B of electrical energy in order to raise the amount of self-consumption of the reserve unit and Epv2d, an energy flow which reaches the group D of electrical consumers from the device PV for the generation of electrical energy.

The last two of these three energy flows are flowing through the first further electrical meter device Z2 downward in a schematic depiction and they are forming the measurement value $Z2d$ in the sum with $Z1d=Eg2d+Esys+Er$. The first energy flow Epv2g flows in the schematic depiction upward and forms the measurement value $Z1u$ in the sum with Er, the transfer energy flow from the electrical transmission network G into the storage B for electrical energy.

Below the first further electrical meter device Z2 the energy flows Eg2d and Epv2d are flowing into the group D of electrical consumers.

The energy flows Er, Esys and Epv2b are flowing in contrary through the second further electrical meter device Z3 into the storage B for electrical energy and can be read as a total as measurement value $Z3d$.

In the opposite direction, the transfer energy flow Eh and the portion of the energy flow in form of the storage-to-consumer energy flow Eb2d flowing out of the storage B for electrical energy, which energy flow also reaches the group D of electrical consumers in order to cover their required power in form of the collected consumers together with the portions of energy flow Epv2d and Eg2d. The sum of the energy flows Eb2d and Eh is forming the measurement value $Z3u$ of the second further electrical meter device Z3.

The control unit SE of the system ESS for the storage of electrical energy is so arranged and formed that Eg2d is minimized. This control of the energy flow is performed according to algorithms using a number of current and predicted parameters. These include especially:

the power need of the group D of electrical consumers,
the amount of energy generated by the device PV for the generation of electrical energy,
the amount of energy which is stored in the storage B for electrical energy and
the business relevance of transfer energy flows Eh and Er in an accounting balance with the service contractor, which is selling electrical power to the operator of the reserve unit through the electrical transmission network G.

It is of interest to determine transfer energy flows Eh and Er in a way which is as simple as possible. These two energy flows are designated in the following jointly as transfer energy flow E. If the reserve unit RE and the electrical transmission network G are considered as a closed system, it follows according to the law of energy conservation:

$$E=Ed-Epv2d-Ebe-Eg2re$$

Here, Ebe is the total energy flow flowing out of the storage for electrical energy and Eg2re is the total energy flow flowing between the electrical transmission network G and the reserve unit RE.

All energy flows with the exception of the unknown transfer energy flow E are represented below in a notation using the first electrical meter device Z1 and the further electrical meter devices Z2 and Z3, which are located in the reserve unit as described above.

From $$Ed=Eg2d+Epv2d+Eb2d$$

it follows using:

$$Eg2d+Epv2d=Z2d-Z3d$$

and $$Eb2d=Z3u-Z2u$$

that $$Ed=Z2d-Z3d+Z3u-Z2u$$

The energy flow Epv2d of the device PV for the generation of electrical energy is always a minimum of two energy flows, namely the total energy flow Epv generated by the device PV for the generation of electrical energy and the energy flow Ed required by the group D of electrical consumers.

Written as a formula:

$$Epv2d=\min(Epv;Ed)$$

From formula $$Epv=Epv2g+Epv2b+Epv2d$$

using $$Epv2g=Z1u-Z2u$$

and $$Epv2b+Epv2d=Z2d-Z1d$$

and $$Epv=Z2d-Z1d+Z1u-Z2u$$

it follows that $$Epv2d=\min(Z2d-Z1d+Z1u-Z2u;Z2d-Z3d+Z3u-Z2u)$$

The energy flows Ebe flowing from the storage B for electrical energy are calculated written in terms of a meter as $Ebe=Z3u$.

The energy flows Eg2re flowing from the electrical transmission network G into the reserve unit RE are calculated written in terms of a meter as $Eg2re=Z1d$ Now, all terms from the consideration according to the law of energy conservation:

$$E=Ed-Epv2d-Ebe-Eg2re$$

can be solved in terms of meters:

$$E=Z2d-Z3d+Z3u-Z2u-\min(Z2d-Z1d+Z1u-Z2u; Z2d-Z3d+Z3u-Z2u)-Z3u-Z1d$$

The underlined terms $Z3u$ cancel each other, so that the determination of the transfer energy flow E in terms of meters remains:

$$E=Z2d-Z3d-Z2u-\min(Z2d-Z1d+Z1u-Z2u;Z2d-Z3d+Z3u-Z2u)-Z1d$$

Therefore, for a determination of the transfer energy flow E, which determination is usable an accounting, six electrical meter devices would be needed. It is not cost-efficient to provide all six as calibrated meter devices.

From the side of the control system of the system as a whole there is the premise that the electrical energy generated by the device PV for the generation of electrical energy covers primarily the energy requirements of the group D of electrical consumers. The key word here is the optimization of the self-consumption, which is typically the target in such reserve units for business reasons. Using this premise and considering different definitions by cases concerning the relative sizes of Epv and Ed the formula for the determination of the transfer energy flow can be simplified significantly.

1st Case Group Epv<=Ed:

In the reserve unit there is not enough generation of electrical energy in such a way so that the power requirements of the group D of electrical consumers can be met. Because of this from the minimum function only the first term for Epv remains:

$$E=Z2d-Z3d-Z2u-(Z2d-Z1d+Z1u-Z2u)-Z1d$$

The underlined terms cancel each other, so that $$E=-Z3d-Z1u$$

remains and the amount of the transfer energy flow is calculated as $E=Z3d+Z1u$

1st Case Group, Exception Epv=0→Epv2d:

The device PV for the generation of electrical energy does not generate any electrical energy and thus cannot supply any amount to cover the power requirements of the group of electrical consumers, the energy flow Epv2d equals zero. Therefore, the consideration according to the law of energy conservation simplifies as follows:

$$E=Ed-Ebe-Eg2re$$

written in terms of meters:

$$E=Z2d-Z3d+Z3u-Z2u-Z3u-Z1d$$

Terms $Z3u$ cancel each other:

$$E=Z2d-Z3d-Z2u-Z1d$$

For Epv2d=0 it follows necessarily that $Z1d=Z2d$ and $Z1u=Z2u$
Thereby, it simplifies $E=-Z3d-Z1u$ and the magnitude of the transfer energy flow results as $E=Z3d+Z1u$ This is the same as the result of the first case group. In consequence, Epv<Ed with the extreme case Epv=0 is considered consistently as first case group.

2nd Case Group Epv>Ed, that is to Say Epv2d=Ed:

The device PV for the generation of electrical energy generates so much energy that the power requirement of the group D of electrical consumers can be completely covered. Thereby, the consideration according to the law of energy conservation simplifies as follows:

$$E=Ed-Ed-Ebe-Eg2re$$

$$E=-Ebe-Eg2re$$

$$E=-Z3u-Z1d$$

as a magnitude:

$$E=Z3u+Z1d$$

This consideration includes so-called energy flows which are necessary for maintaining the system within the determined transfer energy flow E. However, these falsify the result relevant for accounting and are therefore extracted by method tasks in the further method. Energy flows Esys necessary for maintaining the system occur with typical measurement values when for example the storage B for electrical energy is empty and when the device PV for generating electrical energy is not generating any electrical energy currently and in the foreseeable future so that an unwanted deep discharge of the storage is impending. Then, the storage B for electrical energy is being charged by using energy from the electrical transmission network G at least up to a minimum state of charge. Further examples for energy flows necessary for maintaining the system are explained in the framework of the dependent claims.

Figure 3A:
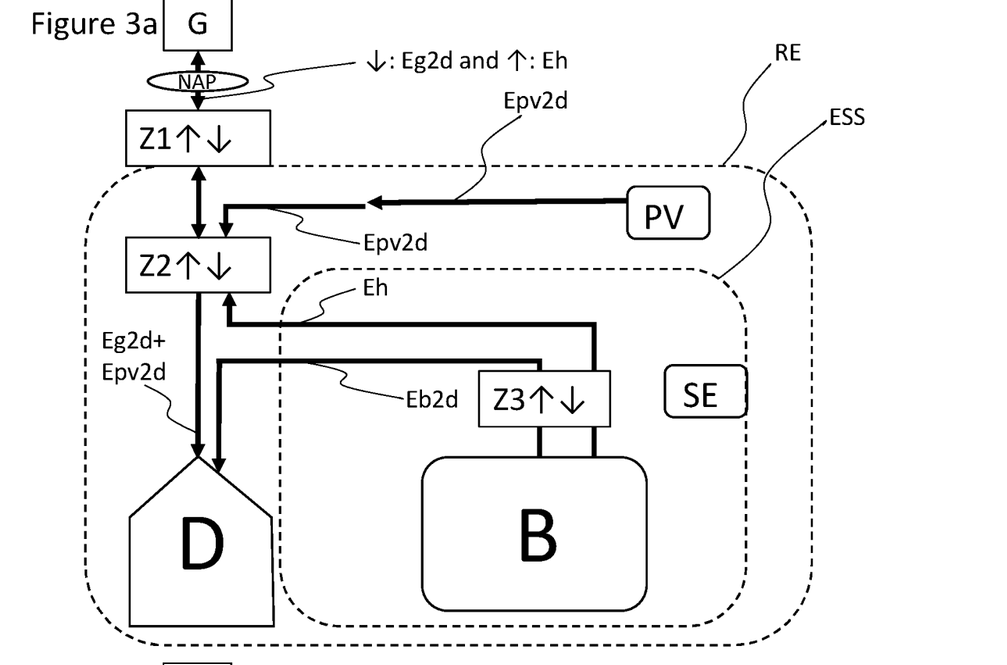
FIG. 3a is a schematic depiction of the energy flows between the components of the system from the FIGS. 1 and 2 for a first case group Epv<=Ed with the boundary condition that the storage B for electrical energy is discharging.

FIG. 3a shows the remaining energy flows between the components of the system of the FIGS. 1 and 2 for the first case group Epv<=Ed together with the further boundary condition of a discharging storage B for electrical energy. At least in the case when the storage B for electrical energy is formed as a battery, this battery can only charge or discharge. Charging and discharging at the same time are not possible for electrophysical reasons. For such a discharging storage B for electrical energy, it follows necessarily that no energy flow can occur in the direction of the storage B for electrical energy—thus, $Z3d$ has to be zero.

From this it follows for $E=Z3d+Z1u$ that $E=Z1u$. Thus, the transfer energy flow E to be determined occurs as a single measurement value $Z1u$ of the first electrical meter device Z1. As this device is typically giving calibrated measurement values at the point NAP of connection to the network, the transfer energy flow E can be determined in this way for the first case group with the boundary condition of a discharging storage B for electrical energy in a way suitable for accounting.

Figure 3B:
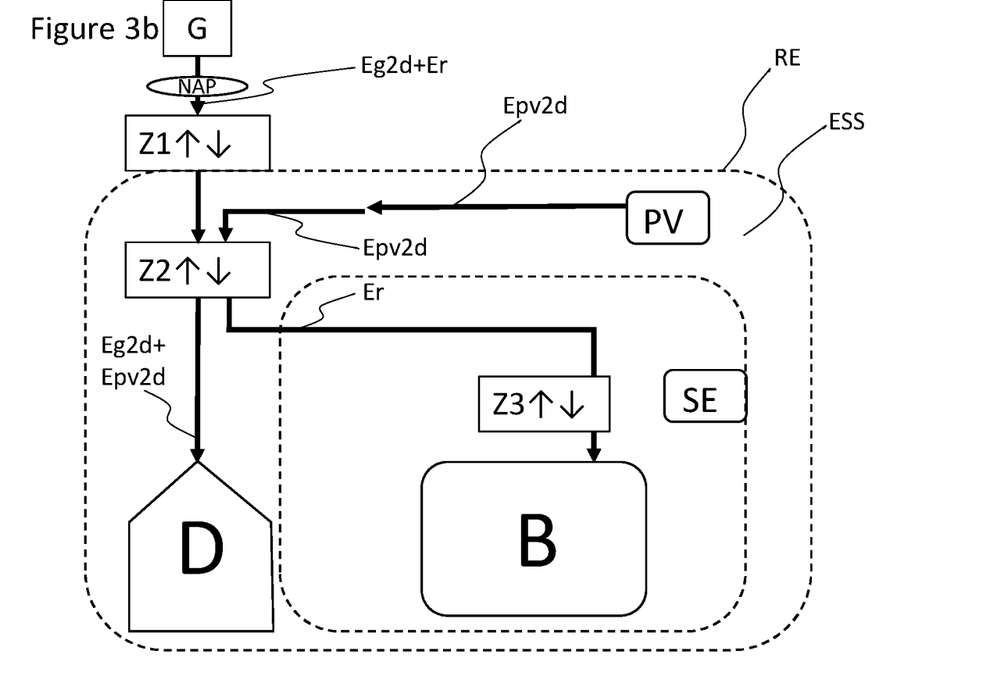
FIG. 3b is a schematic depiction of the energy flows between the components of the system from the FIGS. 1 and 2 for the first case group Epv<=Ed with the boundary condition that the storage B for electrical energy is charging.

FIG. 3b shows the remaining energy flows between the components of the system of the FIGS. 1 and 2 for a case group Epv<=Ed together with the boundary condition of a charging storage B for electrical energy. For such a charging storage B for electrical energy, it follows necessarily that no energy flow can occur out of the storage B for electrical energy—thus, $Z1u$ has to be zero.

From this it follows for $E=Z3d+Z1u$ that $E=Z3d$. Thus, the transfer energy flow E to be determined occurs as a single measurement value $Z3d$ of the second further electrical meter device Z3. If this device is giving calibrated measurement values, the transfer energy flow E can be determined in this way for the first case group with the boundary condition of a charging storage B for electrical energy in a way suitable for accounting.

Figure 4A:
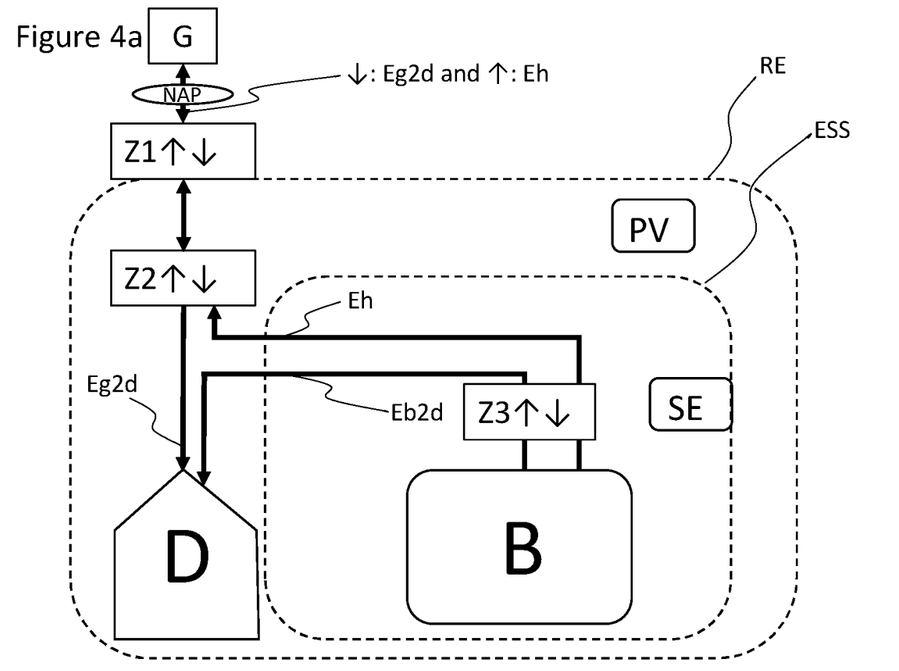
FIG. 4a is a schematic depiction of the energy flows between the components of the system from the FIGS. 1 and 2 for the first case group Epv=0<Ed for the special case Epv=0 with the boundary condition that the storage B for electrical energy is discharging.

FIG. 4a shows the energy flows between the components of the system of the FIGS. 1 and 2 for the first case group Epv=0<Ed for the exception Epv=0 together with the boundary condition of a discharging storage B for electrical energy. As shown above, for the transfer energy flow E=Z3$d$+Z1$u$ holds also in this case. Because the storage B for electrical energy is exclusively discharging, Z3$d$ equals zero and the transfer energy flow E to be determined results as the single measurement value Z1$u$ of the calibrated first electrical meter device Z1.

Figure 4B:
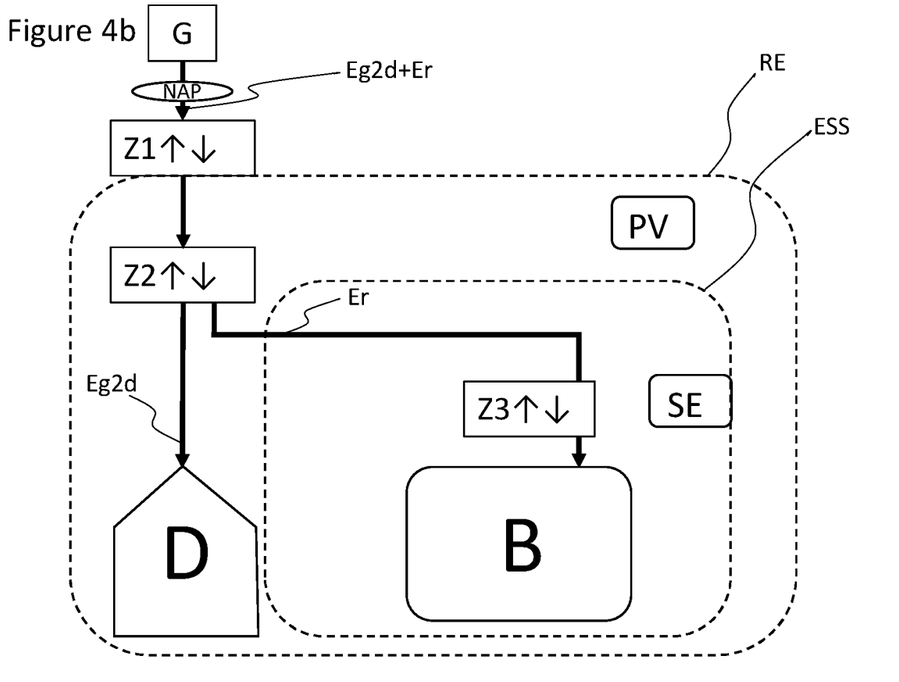
FIG. 4b is a schematic depiction of the energy flows between the components of the system from the FIGS. 1 and 2 for a first case group Epv=0<Ed for the special case Epv=0 with the boundary condition that the storage B for electrical energy is charging.

FIG. 4$b$ shows the remaining energy flows between the components of the system of the FIGS. 1 and 2 for the first case group Epv=0<Ed for the exception Epv=0 together with the boundary condition of a charging storage B for electrical energy. As shown above, for the transfer energy flow E=Z3$d$+Z1$u$ holds also in this case. Because the storage B for electrical energy is exclusively charging, Z1$u$ equals zero and the transfer energy flow E to be determined results as the single measurement value Z3$d$ of the calibrated second further electrical meter device Z3.

Figure 5A:
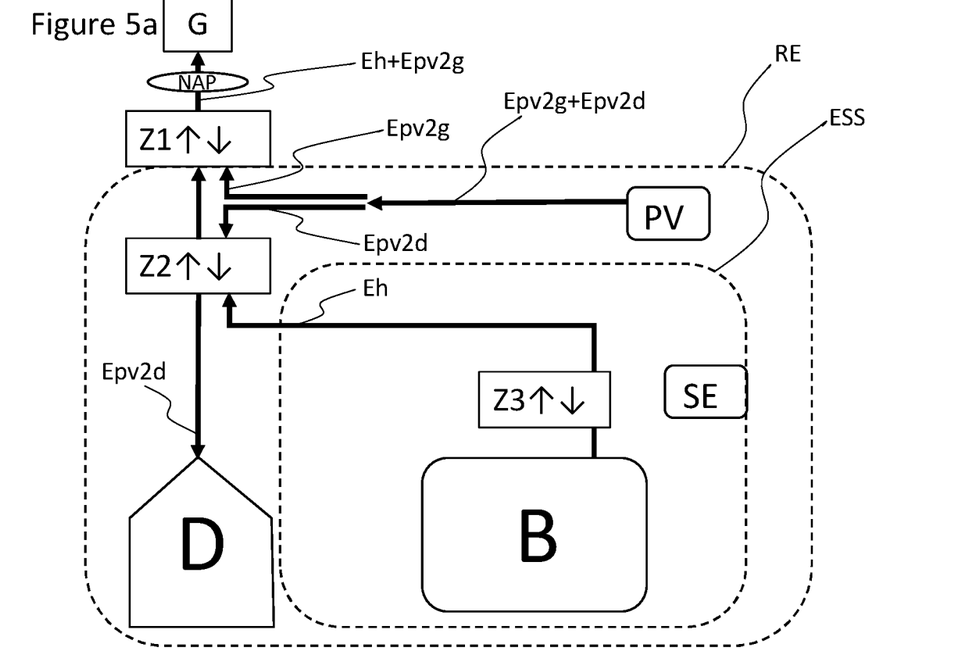
FIG. 5a is a schematic depiction of the energy flows between the components of the system from the FIGS. 1 and 2 for a second case group Epv>Ed with the boundary condition that the storage B for electrical energy is discharging.

FIG. 5$a$ shows the remaining energy flows between the components of the system of the FIGS. 1 and 2 for the second case group Epv>Ed with the boundary condition of a discharging storage B for electrical energy. There is no energy required from the electrical transmission network G to cover the power requirements of the group D of electrical consumers—thus Eg2$d$=0. As established previously the transfer energy flow E to be determined results from E=Z3$u$+Z1$d$, wherein no energy flow in the opposite direction can possibly flow from the electrical transmission network G into the reserve unit. In consequence, Z1$d$ equals zero and the transfer energy flow E to be determined E=Z3$u$.

Figure 5B:
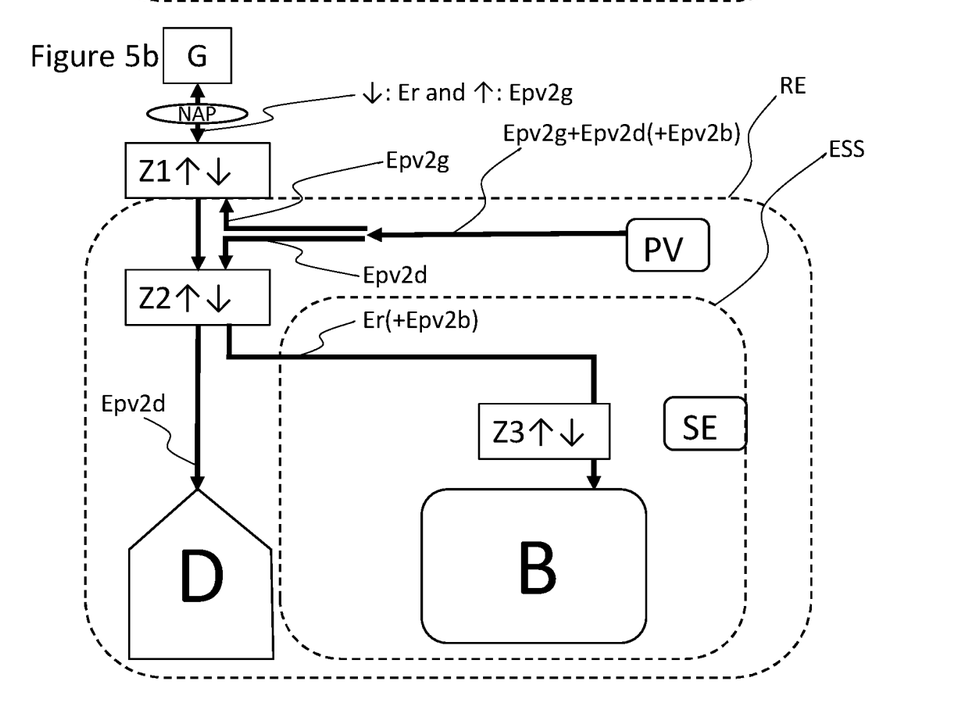
FIG. 5b is a schematic depiction of the energy flows between the components of the system from the FIGS. 1 and 2 for the second case group Epv>Ed with the boundary condition that the storage B for electrical energy is charging.

FIG. 5$b$ shows the remaining energy flows between the components of the system of the FIGS. 1 and 2 for the second case group Epv>Ed with the boundary condition of a charging storage B for electrical energy. There is no energy required from the electrical transmission network G to cover the power requirements of the group D of electrical consumers in this scenario—thus Eg2$d$=0. As established previously the transfer energy flow E to be determined results from E=Z3$u$+Z1$d$, wherein because of the charging storage B for electrical energy no energy flow in the opposite direction can possibly flow from the storage B for electrical energy into the electrical transmission network G. In consequence, Z3$u$ equals zero and the transfer energy flow E to be determined E=Z1$d$.

In result, the method described above allows starting from consideration according to the law of energy conservation to find a notation in terms of meters which becomes so simple by differentiating according to case groups in combination with boundary conditions that the transfer energy flow to be determined occurs as a measurement value of a single electrical meter device.

This goal can also be achieved for a different arrangement of the further electrical meter devices Z2 and Z3 within the reserve unit. It can also be conceived that more than one first and one second further electrical meter device Z2 and Z3 are applied. The decisive point here is a suitable arrangement of measurement devices within the reserve unit in combination with suitable case groups together with combined boundary conditions in order to achieve the result required from this method.

If this result is obtained for a constellation of electrical meter devices within the reserve unit which constellation is well defined, this result is being used afterwards in order to determine the transfer energy flows in a continuous operation of the reserve unit RE. Thus, it is only necessary to perform the method which has been explained above according to an example once to the required result. After that, the ongoing advantage from the use of the result of this method is obtained that the transfer energy flows E between electrical transmission network G and a reserve unit RE can be determined in a way that is suitable for accounting.

Figure 6:
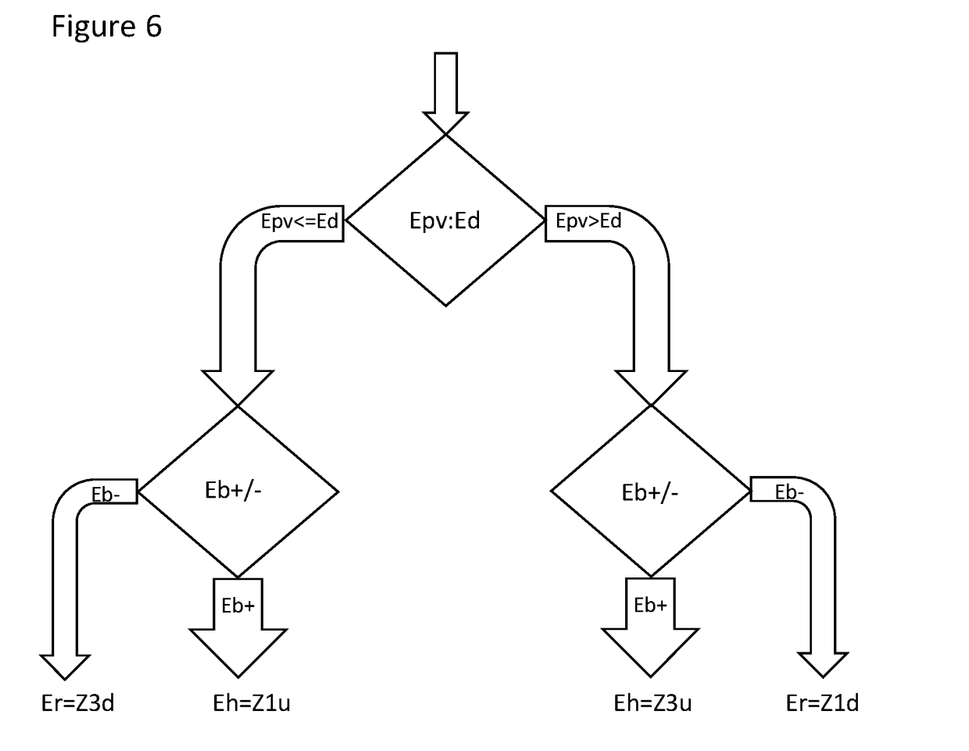
FIG. 6 is a flow diagram for clarification of a use of results of the method for the determination of transfer energy flow.

FIG. 6 shows a flowchart to explain such a use of results of the method in order to determine the transfer energy flow E.

First, the respective magnitudes of the total energy flow Epv of the device PV for the generation of electrical energy and the energy flow Ed required at the same time for the group D of electrical consumers within the reserve unit RE are being determined. Either the first case group with magnitudes Epv<=Ed including the exception Epv=0 or the second case group with Epv>Ed will occur. After that it is determined in a further decision whether the boundary condition of a discharging electrical storage Eb+ or the boundary condition of a charging electrical storage Eb− has occurred. Depending on which boundary condition combined with the respective case group occurs, the transfer energy flow E to be determined will be determined in the form of a transfer energy flow Eh flowing out of the reserve unit or in the form of a transfer energy flow Er flowing into the reserve unit RE. This method of the algorithm uses the results of the method obtained earlier in order to ensure a determination of the transfer energy flows E in a way suitable for accounting. The algorithm shown here will be correspondingly different for the use of other results of the method according to the invention. Such a use of the results of the method is preferably realized in a control unit SE as shown in FIGS. 1 to 5$b$ schematically. The control unit SE is formed and arranged to perform the use of the described results of the method in the framework of an implemented method. However, it is also conceivable that the control unit realized in hard- and software can be realized centralized as a whole or in parts and performs the determination of the transfer energy flows in this way for a multitude of reserve units RE in different locations.

LIST OF REFERENCE NUMERALS

RE reserve unit
D group of electrical consumers
ESS storage system for electrical energy
B storage for electrical energy of the ESS
SE control unit of the storage system for electrical energy ESS
PV device for the generation of electrical energy
NAP connection point of the reserve unit to the network
G electrical transmission network
Z1 first electrical meter device
Z2 first further electrical meter device
Z3 second further electrical meter device
E transfer energy flow
Er transfer energy flow from the transmission network into the reserve unit
Eh transfer energy flow from the reserve unit into the transmission network
Ed intake energy flow of the group of electrical consumers D
Eg2$re$ network energy flow from the transmission network into the reserve unit
Eg2$d$ amount of the network energy flow into the group D of consumers
Epv2$d$ generator-to-consumer energy flow of the device for the generation of electrical energy
Epv total generator energy flow of the device for the generation of electrical energy Epv2g generator energy flow as feed into the transmission network G
Ebe storage energy flow out of the storage B for energy
Eb2d storage-to-consumer energy flow out of the storage B for energy
Esys energy flow necessary for maintaining the system

The invention claimed is:

1. A method for the determination of a transfer energy flow (E) into a or out of a reserve unit (RE), the reserve unit (RE) comprising:
a group (D) of electrical consumers,
a storage system (ESS) for electrical energy with a storage (B) for electrical energy, and
a device (PV) for the generation of electrical energy;
wherein the reserve unit (RE) is defined by a network connection point (NAP) and connected by this network connection point (NAP) to an electrical transmission network (G), wherein a first electrical meter device (Z1) is provided at the network connection point (NAP) for the determination of a measurement value Z1d as a network energy flow out of the transmission network (G) into the reserve unit (RE) and for the determination of a measurement value Z1u as a network energy flow out of the reserve unit (RE) into the transmission network (G);
the method being characterized by performing the following tasks:
determining an intake energy flow (Ed) comprising the group of electrical consumers (D) in a defined time interval,
determining a network energy flow (Eg2re) from the electrical transmission network (G) into the reserve unit (RE) in the defined time interval,
determining a generator energy flow of the device (PV) for the generation of electrical energy in the defined time interval,
determining a storage energy flow (Ebe) between the storage (B) for electrical energy of the storage system (ESS) for electrical energy and the group (D) of electrical consumers and/or the electrical transmission network (G) in the defined time interval, and
determining the transfer energy flow (E) in the defined time interval according to the law of energy conservation;
wherein further electrical energy flows within the reserve unit (RE) between at least two components selected from:
the energy storage system (ESS),
the device (PV) for the generation of energy, and
the group (D) of electrical consumers,
are determined by further electrical meter devices (Z2, Z3) in such a way that, in a case differentiation selected from the two case groups:
the energy generating device (PV) generates more electrical power than required by the group (D) of electrical consumers, and
the energy generating device (PV) generates no or the same amount or less electrical power than required by the group (D) of electrical consumers, combined with a boundary condition selected from:
the storage (B) for electrical energy is charging and the storage (B) for electrical energy is discharging,
the transfer energy flow (E) of the selected case group with the combined boundary condition occurs as a measured value of a single one of the first or one of the further electrical meter devices (Z1, Z2, Z3) for the selected case group with the combined boundary condition;
further characterized in that the determining of the transfer energy flow is performed as a determining of the generator-to-consumer energy flow (Epv2d) from the device (PV) for the generation of electrical energy into the group (D) of electrical consumers within the defined time interval, and
the determining of the intake energy flow (Ed) is being performed as a determining of the intake energy flow (Ed) of the group (D) of electrical consumers within the defined time interval; wherein
the determination of the transfer energy flow (E) is performed according to the law of energy conservation according to the formula: E=(Ed−Epv2d−Ebe−Eg2re).

2. Method according to claim 1 characterized in that the determining of the generator energy flow (Ep2vd) from the device (PV) for the generation of electrical energy to the group (D) of electrical consumers is performed within the defined time interval by the first further electrical meter device (Z2) with a measurement value Z2d for an energy flow in the direction towards the group (D) of electrical consumers and/or in the direction towards the storage system (ESS) for electrical energy and with a measurement value Z2u for an energy flow with the opposite orientation,
wherein the device (PV) for the generation of electrical energy is connected between the first electrical meter device (Z1) and the first further electrical meter device (Z2) in such a way that electrical current which is generated by the device (PV) for the generation of electrical energy can be fed into the electrical transmission network (G) through the first electrical meter device (Z1) as well as it can be directed through the first further meter device (Z2) to the group (D) of electrical consumers and/or to the storage system (ESS) for electrical energy, wherein the generator energy flow (Epv2d) is always determined as the smaller energy flow of the following two energy flows:
intake energy flow (Ed) and
total generator energy flow (Epv).

3. Method according to claim 2 characterized in that a total generator energy flow (Epv) is determined by computing the difference between the measurement value Z2d of the energy flow of the first further meter device (Z2) in the measurement value Z1d of the network energy flow (Eg2re) and the following difference is added to that:
the measurement value Z2u is subtracted from the measurement value Z1u as network energy flow (Eg2re) from the reserve unit into the electrical transmission network.

4. Method according to claim 2 characterized in that a storage-to-consumer energy flow (Eb2d) from the storage (B) for electrical energy of the storage system (ESS) for electrical energy to the group (D) of electrical consumers is performed within the defined time interval by calculating a difference as follows: from the intake energy flow (Ed) as it has been determined the energy flow Z2d which has been measured with the first further electrical meter device (Z2) is subtracted if the difference so formed is greater than zero, and if the difference so formed is smaller than zero the storage-to-consumer energy flow (Eb2d) is set to zero.

5. Method according to claim 4 characterized in that
an energy flow into the storage (B) for electrical energy is determined by a measurement value Z3d and that the storage energy flow out of the storage (B) for electrical energy is determined by a measurement value Z3u by means of the second further meter device (Z3) arranged upstream of the storage (B) of electrical energy, and the two case groups concerning the comparison of the size of the intake energy flow (Ed) to the total generator energy flow (Epv) are being determined by means of the measurement values of the first meter device (Z1) and by means of the measurement values of the second further meter device (Z3) as follows:

for the size comparison the total generator energy flow Epv corresponds to $Z1u-Z1d$ and the intake energy flow Ed corresponds to $Z3u-Z3d$.

6. Method according to claim 5 characterized in that for the case group that the total generator energy flow (Epv) is larger than the intake energy flow (Ed):

the transfer energy flow (E) is determined as the measurement value $Z1d$ for the boundary condition that the storage (B) for electrical energy is charging, meaning $Z3d>0$, the transfer energy flow (E) is determined as the measurement value $Z3u$ for the boundary condition that the storage (B) for electrical energy is discharging, meaning $Z3u>0$ and for the case group that the total generator energy flow (Epv) is smaller than or equal to the intake energy flow (Ed), including the case that the total generator energy flow (Epv) equals zero:

the transfer energy flow (E) is determined as the measurement value $Z3d$ for the boundary condition that the storage (B) for electrical energy is charging, meaning $Z3d>0$, the transfer energy flow (E) is determined as the measurement value $Z1u$ for the boundary condition that the storage (B) for electrical energy is discharging, meaning $Z3u>0$.

7. The method of claim 6 characterized in that intake energy flows (Esys), which are necessary for maintaining the system and which are directed into the storage system (ESS) for electrical energy and which are not comprised by a defined intake energy flow (Ed) of the group of electrical consumers (D), are being determined and accounted for with respect to the determined transfer energy flow (E).

8. The method of claim 7 characterized in that when determining intake energy flows (Esys), which are necessary for maintaining the system, which are directed into the storage system (ESS) for electrical energy and which are not comprised by a defined intake energy flow (Ed) and which are caused by one or more of the intake energy flows (Esys), which are necessary for maintaining the system, are being used in order to correct the determined transfer energy flow (E).

9. The method of claim 8 characterized in that the energy flows (Esys) which are necessary for maintaining the system are selected from a group comprising:

an energy flow caused by a power intake of an inverter during standby which inverter is part of the energy storage system (ESS), when the storage (B) of electrical energy is depleted and cannot supply the power intake during standby, an energy flow caused by trickle charging the storage (B) for electrical energy being part of the storage system (ESS) for electrical energy and an energy flow caused by periodically fully charging the storage (B) for electrical energy being part of the storage system (ESS) for electrical energy.

10. The method of claim 7 characterized in that the energy flows (Esys) which are necessary for maintaining the system are selected from a group comprising:

an energy flow caused by a power intake of an inverter during standby which inverter is part of the energy storage system (ESS), when the storage (B) of electrical energy is depleted and cannot supply the power intake during standby, an energy flow caused by trickle charging the storage (B) for electrical energy being part of the storage system (ESS) for electrical energy and an energy flow caused by periodically fully charging the storage (B) for electrical energy being part of the storage system (ESS) for electrical energy.

11. The method of claim 1 characterized in that intake energy flows (Esys), which are necessary for maintaining the system and which are directed into the storage system (ESS) for electrical energy and which are not comprised by a defined intake energy flow (Ed) of the group of electrical consumers (D), are being determined and accounted for with respect to the determined transfer energy flow (E).

* * * * *